(12) United States Patent
Weling et al.

(10) Patent No.: US 8,440,569 B2
(45) Date of Patent: May 14, 2013

(54) METHOD OF ELIMINATING A LITHOGRAPHY OPERATION

(75) Inventors: Milind Weling, Pleasanton, CA (US); Abdurrahman Sezginer, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 382 days.

(21) Appl. No.: 11/952,703

(22) Filed: Dec. 7, 2007

(65) Prior Publication Data

US 2009/0146322 A1 Jun. 11, 2009

(51) Int. Cl.
*H01L 21/302* (2006.01)

(52) U.S. Cl.
USPC ........... 438/717; 438/942; 438/975; 257/435; 257/797; 257/E23.179; 257/E21.038

(58) Field of Classification Search ............... 438/401, 438/424, 584, 597, 639, 689, 696, 700, 702, 438/717, 942, 947, 975; 257/435, 797, 798, 257/E23.179, E21.035, E21.038, E21.039, 257/E21.232
See application file for complete search history.

(56) References Cited

U.S. PATENT DOCUMENTS

| | | | | |
|---|---|---|---|---|
| 5,363,171 A * | 11/1994 | Mack | ........................ | 355/68 |
| 6,221,562 B1 * | 4/2001 | Boyd et al. | .................... | 430/314 |
| 7,012,003 B2 * | 3/2006 | Tobben | ........................ | 438/257 |
| 7,202,174 B1 * | 4/2007 | Jung et al. | ..................... | 438/694 |
| 7,407,890 B2 * | 8/2008 | Yang | ............................. | 438/696 |
| 7,666,578 B2 * | 2/2010 | Fischer et al. | ................ | 430/314 |
| 7,856,613 B1 * | 12/2010 | Weling et al. | .................. | 378/35 |
| 2003/0182098 A1 * | 9/2003 | Ehrler | ............................ | 703/19 |
| 2003/0230234 A1 * | 12/2003 | Nam et al. | ...................... | 117/97 |
| 2007/0077524 A1 * | 4/2007 | Koh et al. | ..................... | 430/314 |
| 2007/0099431 A1 * | 5/2007 | Li | ................................ | 438/735 |
| 2007/0158688 A1 * | 7/2007 | Caspary et al. | ............... | 257/208 |
| 2007/0249174 A1 * | 10/2007 | Yang | ............................ | 438/712 |
| 2008/0248654 A1 * | 10/2008 | Jung | ............................ | 438/736 |

* cited by examiner

*Primary Examiner* — William D Coleman
*Assistant Examiner* — Su Kim
(74) *Attorney, Agent, or Firm* — Kenyon & Kenyon LLP

(57) ABSTRACT

Methods of semiconductor device fabrication are disclosed. An exemplary method includes processes of depositing a first pattern on a semiconductor substrate, wherein the first pattern defines wide and narrow spaces; depositing spacer material over the first pattern on the substrate; etching the spacer material such that the spacer material is removed from horizontal surfaces of the substrate and the first pattern but remains adjacent to vertical surfaces of a wide space defined by the first pattern and remains within narrow a space defined by the first pattern; and removing the first pattern from the substrate. In one embodiment, the first pattern can comprise sacrificial material, which can include, for example, polysilicon material. The deposition can comprise physical vapor deposition, chemical vapor deposition, electrochemical deposition, molecular beam epitaxy, atomic layer deposition or other deposition techniques. According to another embodiment, features for lines and logic device components having a width greater than that of the lines are formed in the spacer material in the same mask layer.

13 Claims, 10 Drawing Sheets

METHOD OF ELIMINATING A LITHOGRAPHY OPERATION

TECHNICAL FIELD

The present invention relates to device manufacturing, and more particularly, some embodiments relate to semiconductor device fabrication techniques.

DESCRIPTION OF THE RELATED ART

Integrated circuits, or ICs, are generally created by patterning a plurality of devices and their interconnects onto a substrate such as a semiconductor wafer. This process generally starts with a design for the circuit or circuits that will make up the IC. A top-down design methodology is commonly employed using hardware description languages (HDLs), such as Verilog®, RTM® or VHSIC hardware description language (VHDL), for example. Through the use of HDLs, the designer creates an integrated circuit by hierarchically defining functional components of the circuit.

From the HDL or other high-level description, the actual logic cell implementation may be determined by logic synthesis, which converts the functional description of the circuit into a specific circuit implementation. The logic cells are then assigned physical locations in the device layout and their interconnections are defined. This is sometimes referred to as layout and routing. The placement and routing tools used by designers generally accept as their input a flattened netlist that has been generated by the logic synthesis process. This flattened netlist identifies the specific logic cell instances from a target standard cell library, and describes the specific cell-to-cell connectivity. By application of a physical design process, the logic cells of the netlist file are placed and routed, resulting in a layout file. This layout, then, can be transferred or applied to the semiconductor substrate in a series of layers that collectively will form the devices that make up the components of the integrated circuit.

A process by which such layers are patterned on the substrate is known as photolithography. During photolithography, a series of photomasks are created from the layout file, and are used to transfer the layout onto the substrate layer by layer. A photomask, or more simply a mask, provides the image of the physical geometries of an integrated circuit layer. There are different types of masks, including binary, chrome-on-glass, attenuated phase-shifting masks (attPSM) and alternating phase-shifting masks (altPSM). The mask is used to transfer the layout pattern for its associated layer onto the wafer. The mask allows light to pass through transparent sections defined by the mask elements written or etched thereon. An image of the mask is then passed through an imaging lens system and focused at the desired size on the wafer surface. A typical photolithography system projects UV light energy through the mask and the lens system to project the mask pattern in reduced size onto the wafer surface. The projected light pattern interacts with a photosensitive coating on the wafer. Depending on the photosensitive coating used, it can be cured by exposure to the light or rendered susceptible to removal as a result of exposure. Accordingly, the projection of the mask pattern onto the coating can be used to transfer the pattern to the wafer.

With a continuing desire to provide greater functionality in smaller packages and the evolution of more complex system-on-chip and mixed-signal designs, IC feature geometries are being driven smaller and smaller. The ability to project an accurate image of increasingly smaller features onto the wafer is limited by the wavelength of the light used, and the ability of the lens system to capture enough diffraction orders from the illuminated mask.

The minimum feature size that a projection system can print can be approximated by:

$$F = k * \frac{\lambda}{N_A}$$

where F is the minimum feature size, k is a coefficient of process-related factors, λ is the wavelength of light used and $N_A$ is the numerical aperture of the lens as seen from the wafer. With lithography processes using deep ultraviolet (DUV) light with wavelengths of 248 to 193 nm, minimum feature sizes of approximately 50 nm can be achieved. Accordingly, the resolution limit of conventional optical lithography technology is increasingly being challenged by the sub wavelength, or low-k1, dimensions of the critical IC feature geometries.

Not only are the critical dimension feature geometries decreasing in size in accordance with, or even faster than, Moore's Law predictions, the already large number of these feature geometries is growing at a dramatic rate as well. Furthermore, due to the necessity to mitigate optical proximity effect distortions through resolution enhancement techniques at the mask level, the overall polygonal figure count is skyrocketing. These critical feature geometries are patterned far more precisely as well due to the severity and sensitivity of the non-linear imaging. Extreme precision is required for sub wavelength, or low-k1, applications due to highly non-linear imaging behaviors, which often magnify mask errors by large factors and in non-intuitive manners.

With current lithography technology at wavelengths of 193 nm, optical characteristics of the light are affecting the ability to decrease feature sizes. One approach to increasing resolution is to move to a smaller wavelength of light. For example, some approaches have moved to light in approximately the 13 nm extreme UV range. However, such trends have proven difficult for a number of reasons and designers have moved to non-lithographic enhancements to increase pattern density.

One class of technologies presently used to enhance feature density is referred to as double patterning or multiple patterning. There are several types of double patterning in use, the four most common being: double exposure, spacer mask, a heterogeneous mask, and intermediate pattern accumulation. FIG. 1 is a diagram illustrating one example of spacer or self-aligned double patterning. Referring now to FIG. 1, in the first part of the process 100, a sacrificial layer 10 is laid down over a substrate comprising one or more hard mask layers 15, which are in turn deposited over the actual layer 20 that is to be patterned. Sacrificial layer 10 is typically made of polysilicon.

Next, as illustrated at 101, a spacer material 25 such as, for example, silicon nitride or silicon oxide is deposited over the wafer. Also illustrated at 101 is the patterning of a photoresist 30 to protect the spacer material in selected locations. Accordingly, another mask layer is used to apply patterns of photoresist 30 at desired locations. As illustrated at 102, spacer material 25 is etched anisotropically, preferentially removing the spacer material on the horizontal surfaces. As a result, the structure illustrated in 103 remains, sacrificial layer 10 having been etched away. After a subsequent etch process is performed, the spacer pattern is transferred or etched to the underlying layer 20 as illustrated at 104.

FIG. 2 is a diagram illustrating a top view of the self-aligned double patterning process and the masks used to make the illustrated features. FIG. 2 shows patterns 12 created by sacrificial layer 10 and Mask A, patterns 14 created by spacer 35 after spacer etch, and components of logic devices 16 created by feature Mask B. With reference to FIG. 1, it is noted that mask B corresponds to patterning of photoresist 30.

Referring again to FIG. 2, as this Figure illustrates, once the polysilicon lines 12 are removed, spacer lines 14 are remaining and the density is approximately doubled. In order to remove the short 50 between each pair of spacer lines 14, a third mask layer mask C is used to remove the unwanted parts of spacer that short remaining trace lines as illustrated by dashed lines 45. As the examples provided in FIGS. 1 and 2 illustrate, for each feature line 12 of sacrificial layer 10, the process yields two lines 14, thereby doubling the density.

As these examples also illustrate, conventional techniques using self-aligned double patterning processes are useful for making lines but have not been used to make arbitrary patterns. In these examples, an additional mask layer (Mask B) is used to make the other patterns 16. Take for instance an example of memory. Memory circuits typically include a large number of lines. However, each line needs a contact to connect the line to associated circuitry. At the same layers, there are also other devices or components of devices such as, for example, contact pads, address decoders, multiplexers, glue logic, registers, bus drivers, and so on (generally referred to as logic devices, components or logic device components). However, as stated, according to conventional wisdom a separate mask layer (mask B) is used to make these components.

BRIEF SUMMARY OF EMBODIMENTS OF THE INVENTION

According to various embodiments of the invention semiconductor devices and methods of manufacture are provided. In one embodiment, lines and components are provided on a layer of a semiconductor device, wherein the lines are of a first width and components, such as contact pads or other components, are of a second width. In accordance with one embodiment of the invention, the lines and contact pads are formed on a layer of the device without the need for an additional mask layer to form the contact pads. In another embodiment, other features in addition to or instead of contact pads can be added in the same mask layer.

According to an embodiment of the invention a method of semiconductor device fabrication includes processes of depositing a layer of a first material on a semiconductor substrate and patterning the layer to form a first pattern, wherein the first pattern defines wide and narrow space features; depositing spacer material over the first pattern on the substrate; and etching the spacer material such that the spacer material is removed from horizontal surfaces of the substrate and the first pattern but remains adjacent to vertical surfaces of a wide space defined by the first pattern and remains within a narrow space defined by the first pattern. The first material can be removed from the substrate or additional material can be added and the device polished. In one embodiment, the first pattern can comprise sacrificial material, which can include, for example, polysilicon material. The deposition can comprise physical vapor deposition, chemical vapor deposition, electrochemical deposition, molecular beam epitaxy, atomic layer deposition or other deposition techniques. According to another embodiment, features for lines and logic device components having a width greater than that of the lines are formed in the spacer material in the same mask layer.

In one embodiment, the remaining spacer material forms a spacer pattern and the spacer material comprises, for example, silicon nitride, silicon oxide or silicon oxynitride. The operation can further include etching the substrate to transfer the spacer pattern to an underlying layer. In another embodiment, the remaining spacer material is etched to trim contact pads or other features created by the remaining spacer material.

In one embodiment, the spacer material remaining in the narrow space is approximately twice the width of the spacer material remaining adjacent vertical surfaces of the wide space. Additionally, in another embodiment, the spacer material remaining in the narrow space is in a range of from one to two times the width of the spacer material remaining adjacent vertical surfaces of the wide space.

In yet another embodiment of the invention, a method of semiconductor device fabrication, includes depositing a layer of a first material on a substrate of the semiconductor device and patterning the layer to form a pattern, wherein the pattern comprises an elongated trace defined by the first material and a cavity defined by the first material; depositing second material over the substrate; and etching the second material such that the second material is partially removed from the substrate, thereby forming a pattern of second material, the pattern of second material comprising a first feature adjacent the line and a second feature within the cavity. The first material can be removed from the substrate or additional material can be added and the device polished. In one embodiment, the second material in the cavity is approximately twice the width of the second material adjacent the line, while in another embodiment, the second feature is in a range of from one to two times the width of the first feature.

In one application of an embodiment, the first and second features are for lines and logic device components, and the first and second features are formed in the second material in the same mask layer. In a further application, the first feature is part of a memory array and the second feature is part of a circuit associated with the memory array.

The second material can include, for example, silicon nitride, silicon oxide or silicon oxynitride. In one embodiment, the remaining second material forms a spacer pattern and further comprising etching the substrate to transfer the spacer pattern to an underlying layer. In a further embodiment, the remaining second material can be etched to trim contact pads or other components created by the remaining second material.

In another embodiment, a semiconductor device includes a plurality of layers, which comprise a series of lines and components and the lines and components are fabricated by a method including the operations of depositing a pattern of a first material on a substrate of the semiconductor device, wherein the pattern comprises an elongated trace defined by the first material and a cavity defined by the first material; depositing second material over the substrate; etching the second material such that the second material is partially removed from the substrate, thereby forming a pattern of second material, the pattern of second material comprising a line adjacent the elongated trace and a component within the cavity; and removing the first material from the substrate. In one embodiment, the lines and components are formed in the second material in the same mask layer.

In a further embodiment, a method of producing a dataset for creating a photomask for a layout of a circuit design comprises selecting a first set of data representing line features of the layout; selecting a second set of data representing device features of the layout that are wider than the lines; generating a first subset of the data set, wherein the first subset represents a first pattern of alternating spaces on the layout between the lines; and generating a second subset of the data set, wherein the second subset comprises a second pattern arranged so as to define spaces on the layout that correspond to the device features. In one application, the line features are part of a memory array and the device features are part of a circuit associated with the memory array. In one embodiment, the device features are approximately twice the width of the line features. In another embodiment, the width of the device features is in a range of from one to two times the width of the line features. The method can be performed by a computer program product embodied on computer usable media.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Some of the figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE
EMBODIMENTS OF THE INVENTION

The present invention is directed in various embodiments toward semiconductor devices and systems and methods for semiconductor processing. Particularly, some embodiments relate to spacer double patterning for semiconductor processing. In one embodiment, spacer technology can be used to create conventional spacer lines as well as logic devices that are at dimensions different from the conventional spacer lines. For example, in one embodiment, the invention can use spacer technology to provide logic devices that are approximately 2 times the width of the spacer lines. In another embodiment, the invention can be used to provide irregular shaped logic devices.

Figure 3:
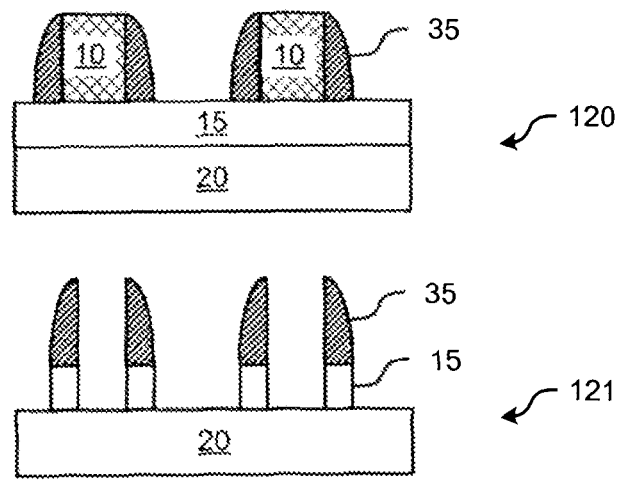
FIG. 3 is a diagram illustrating a cross-sectional view of an example of spacer formation for patterning lines in accordance with one embodiment of the invention.
Figure 4:
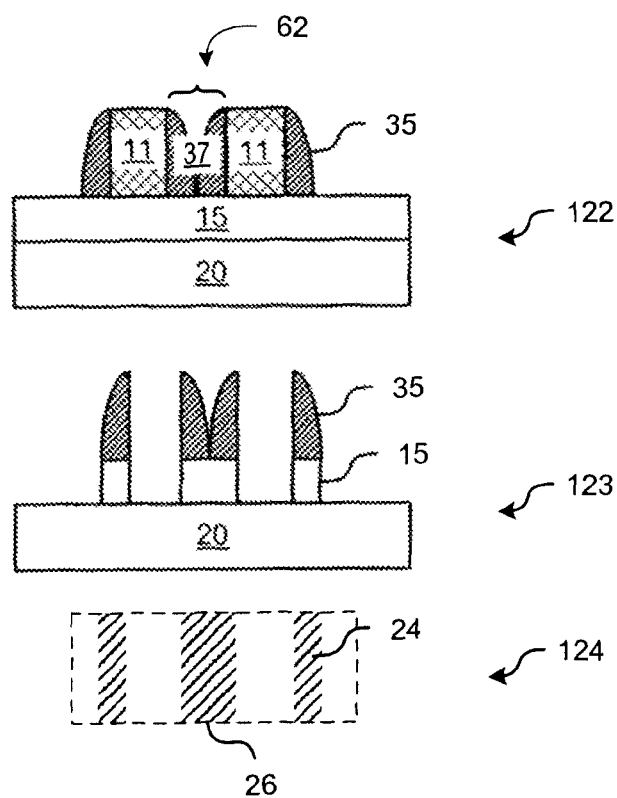
FIG. 4 is a diagram illustrating a cross sectional view of an example of using narrow spaces to create wider feature dimensions in accordance with one embodiment of the invention.

FIG. 3 is a diagram illustrating a cross-sectional view of an example of spacer formation for patterning lines in accordance with one embodiment of the invention. FIG. 4 is a diagram illustrating a cross sectional view of an example of using narrow spaces to create wider feature dimensions in accordance with one embodiment of the invention. Referring now to FIG. 3, illustrated is a simple example of a wide space 120 after spacer formation. As illustrated at 121, after the polysilicon 10 is removed, a series of spacer lines 35 are remaining. In contrast, at FIG. 4, a narrow space 62 is used to create a feature with a double spacer 37 that is twice the width of the conventional spacer lines created with single spacers 35. Particularly, at 122, traces of sacrificial layer 11 are placed closer to one another such that when spacer material is removed from the layer, some spacer material 37 remains in the space 62 formed between the two sacrificial traces 11. Accordingly, after the sacrificial layer is removed and the pattern transferred to substrate 20, a pattern such as that illustrated at 123 remains. Although different reference characters are chosen for spacer material 37 and sacrificial material 11 to illustrate the difference in placement in this example embodiment, one of ordinary skill in the art would understand that conventional materials can be used.

As shown in the partial top-view projection 124 for this example, the resultant structure includes two lines 24 and a logic device component 26, wherein logic device component 26 is approximately twice the width of lines 24. Logic device component 26 might be used, for example, for contact pads or peripheral circuitry and so on. This 2:1 ratio, or approximate 2:1 ratio, can be useful for certain devices such as, for example, memory, which tends to follow this aspect ratio. The actual width of logic device components relative to lines will depend on factors such as the properties of the spacer material, its adherence to vertical surfaces of the sacrificial layer features, characteristics of the etch process and so on. Also, a narrower-width space will result in a narrower feature. However, a wider space may result in a loss of spacer material 37 in portions of the space, depending on materials used, the thickness of the spacer material applied and the etch process.

Accordingly, alternative aspect ratios of other than 2:1 can be achieved by varying these factors.

Figure 5:
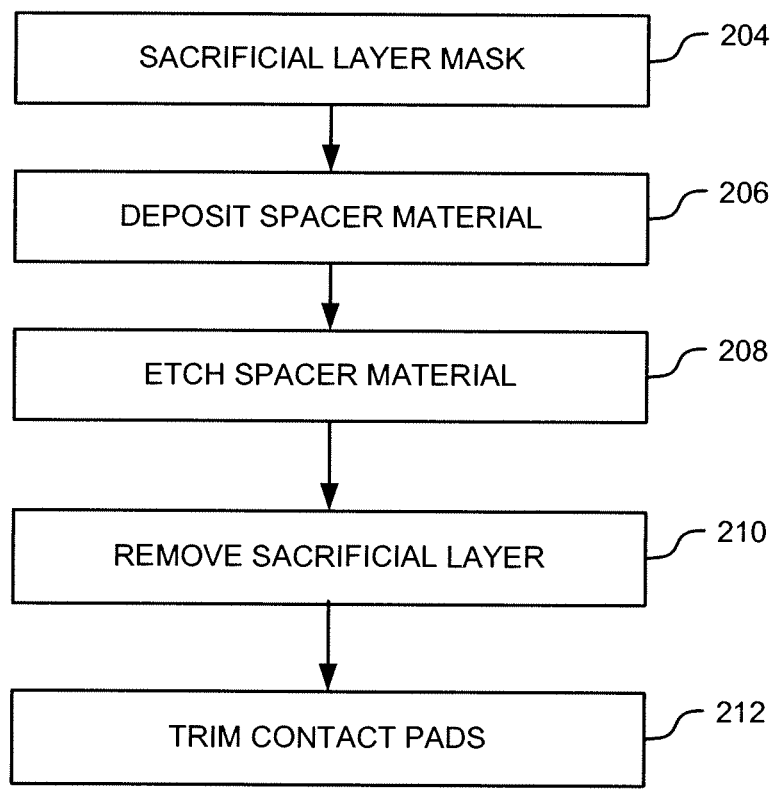
FIG. 5 is an operational flow diagram illustrating an example process for pattern generation in accordance with one embodiment of the invention.
Figure 6:
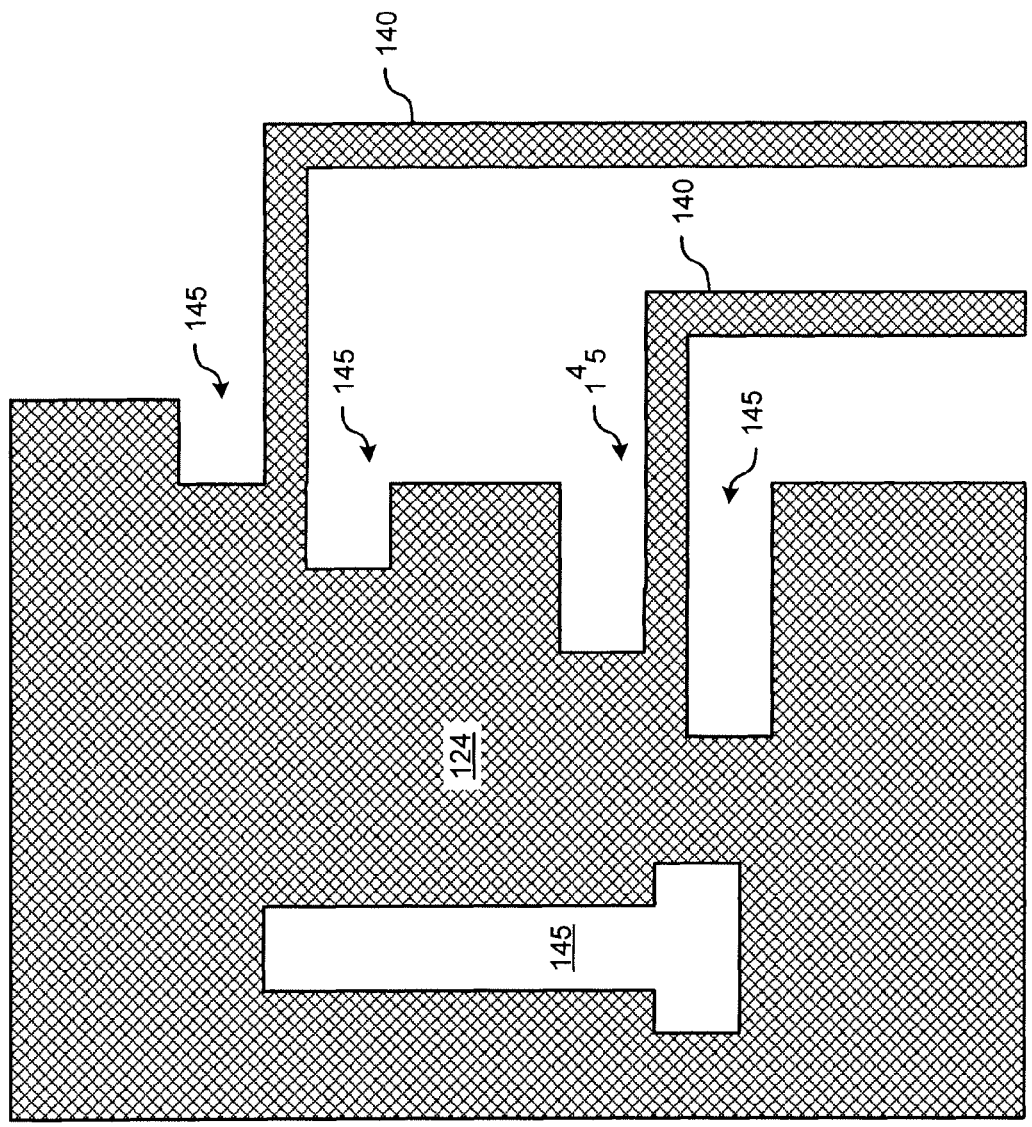
FIG. 6 is a diagram illustrating an example pattern of a spacer material in accordance with one embodiment of the invention.

FIG. 5 is an operational flow diagram illustrating an example process for pattern generation in accordance with one embodiment of the invention. Referring now to FIG. 5, at process element 204, a sacrificial layer is patterned on to the substrate. In one embodiment, the pattern laid out on the substrate includes a combination of lines and spaces. FIG. 6 is a diagram illustrating one example pattern of a spacer material in accordance with one embodiment of the invention. Referring now to FIGS. 5 and 6, in this example, the sacrificial layer 124 includes a pattern of lines 140 and spaces 145. As described in more detail below, lines 140 can be used to create thinner line patterns with spacer material on either side of lines 140, and spaces 145 can be used to create features of various configurations. In one embodiment, spaces 145 can be used to create features of wider width than features created adjacent to lines 140.

At operation 206, spacer material is deposited over the substrate. In one embodiment, spacer material covers both the exposed areas of the substrate as well as the sacrificial layer elements. The spacer material can include materials such as, for example, silicon nitride, silicon oxide or silicon oxynitride. Processes for deposition of this and other layers can include any process that grows, coats, or otherwise transfers or applies a material onto the substrate. For example, deposition can include physical vapor deposition, chemical vapor deposition, electrochemical deposition, molecular beam epitaxy and, atomic layer deposition. Next, at 208, the spacer material is etched. Preferably, the spacer material is etched anisotropically to allow preferential removal of the spacer material on horizontal surfaces.

Figure 7:
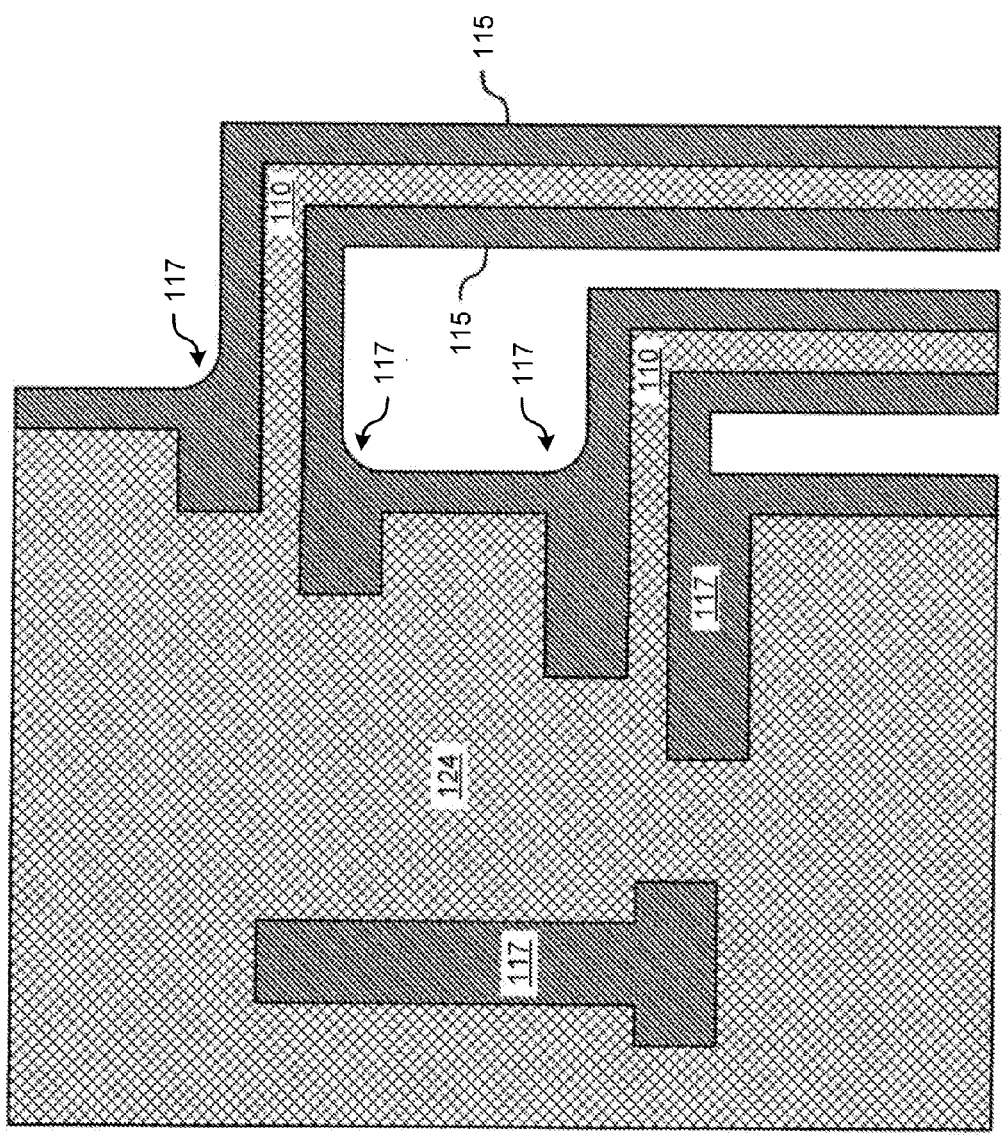
FIG. 7 is a diagram illustrating a top-down view of the example element illustrated in FIG. 6 after spacer deposition and etch in accordance with one embodiment of the invention.

FIG. 7 is a diagram illustrating a top-down view of the example element of FIG. 6 after spacer deposition and etch. As this example illustrates, the remaining spacer material creates a pattern of lines 115 adjacent traces 110 and features 117 within spaces 145. As this example further illustrates, because sacrificial layer is configured to include spaces as well as for line traces, larger-width elements of spacer material can be left on the substrate.

Figure 1:
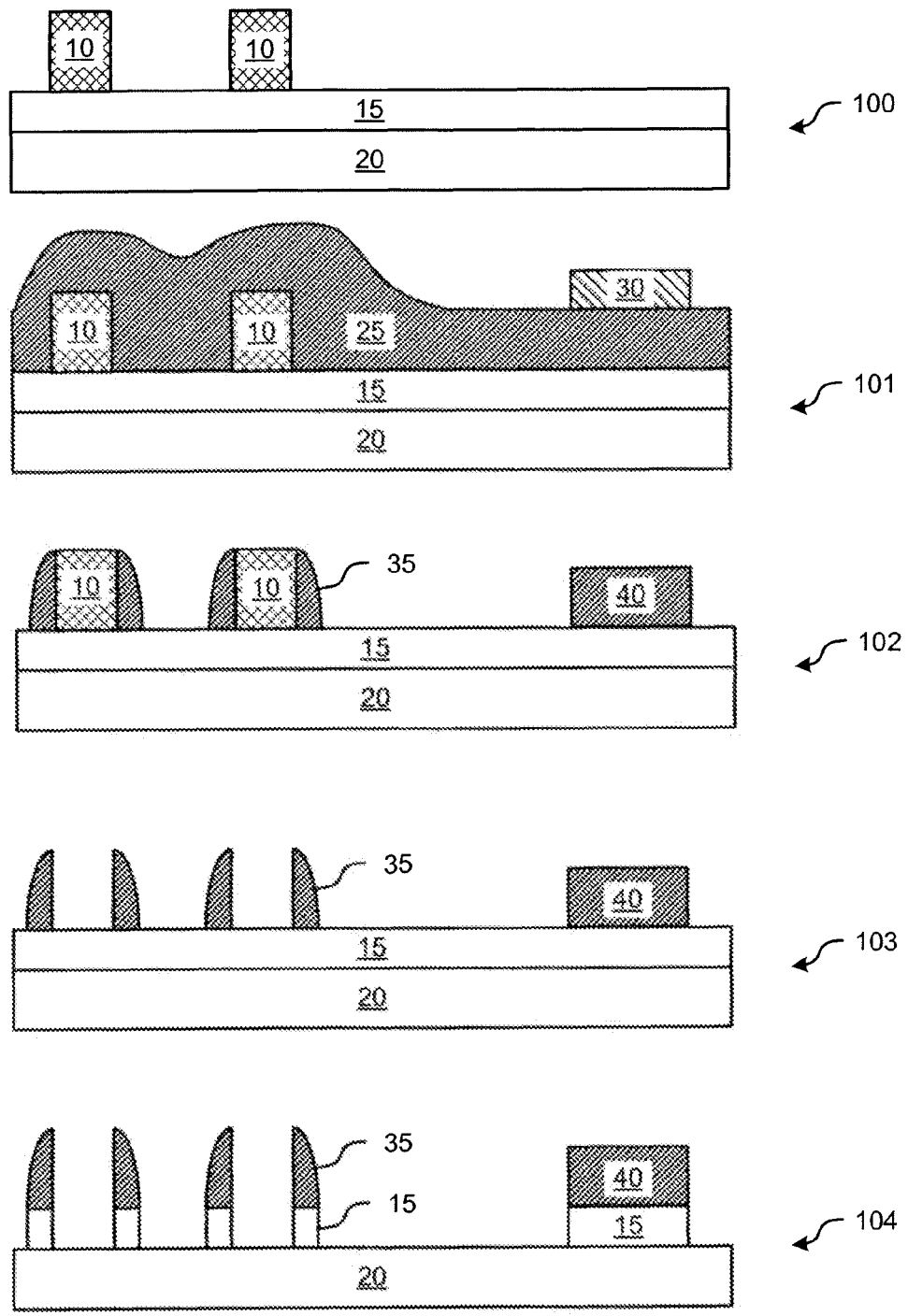
FIG. 1 is a diagram illustrating one example of spacer or self-aligned double patterning.
Figure 8:
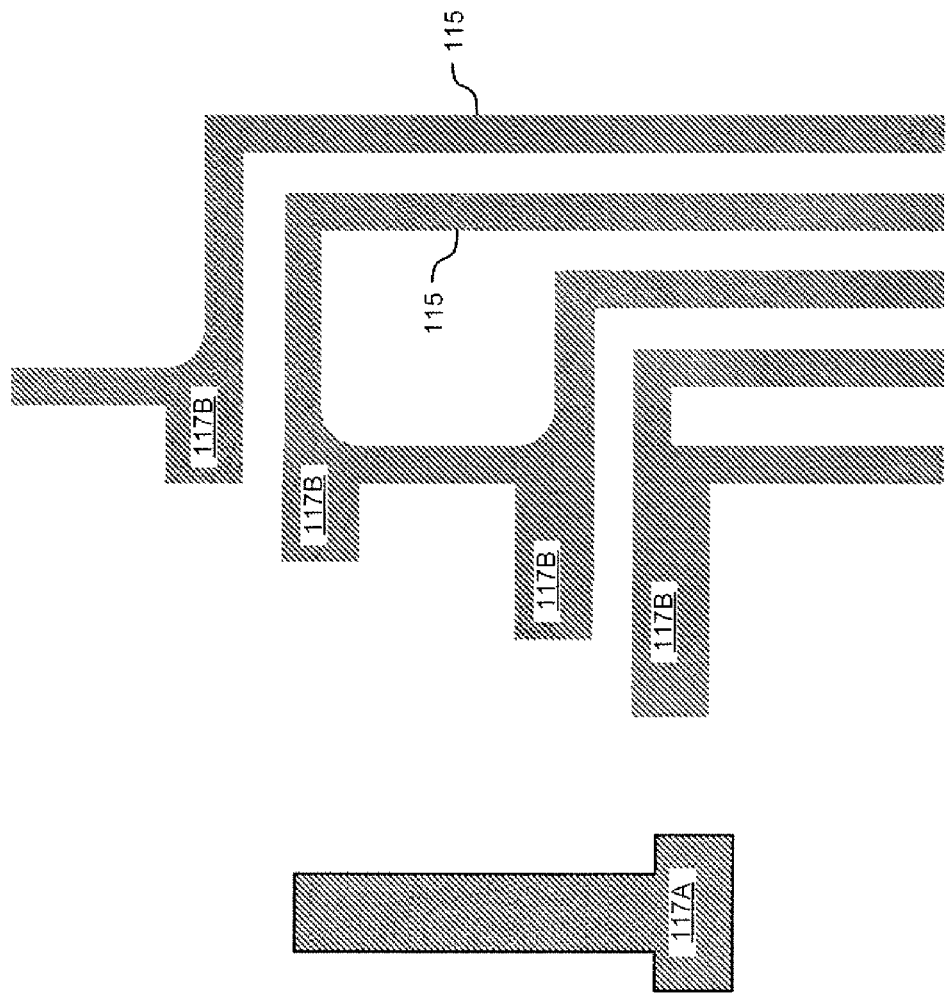
FIG. 8 is a diagram illustrating a top-down view in accordance with this example after removal of the sacrificial layer in accordance with one embodiment of the invention.

At operation 210, the sacrificial layer is etched to remove it from the substrate. FIG. 8 is a diagram illustrating a top-down view in accordance with this example after removal of the sacrificial layer. As this example illustrates, the remaining pattern of spacer material includes line patterns 115, and feature patterns 117. Feature patterns 117B might be used, for example, for contact pads and feature pattern 117A might be used for other elements such as, for example, components of a logic device. Accordingly, because these contacts and other features 117 can be created at the same time with the same mask layers as the lines 115 using the spacer material, the additional lithography step of laying down a pattern of photoresist 30 (e.g. Mask B of FIG. 1) can be avoided.

In an alternative embodiment, instead of removing the sacrificial layer from the substrate, another approach is to deposit more of the sacrificial material onto the substrate and then to planarize or polish the surface. For example, planarization can be performed using chemical-mechanical polishing (CMP) or other planarization techniques.

Figure 2:
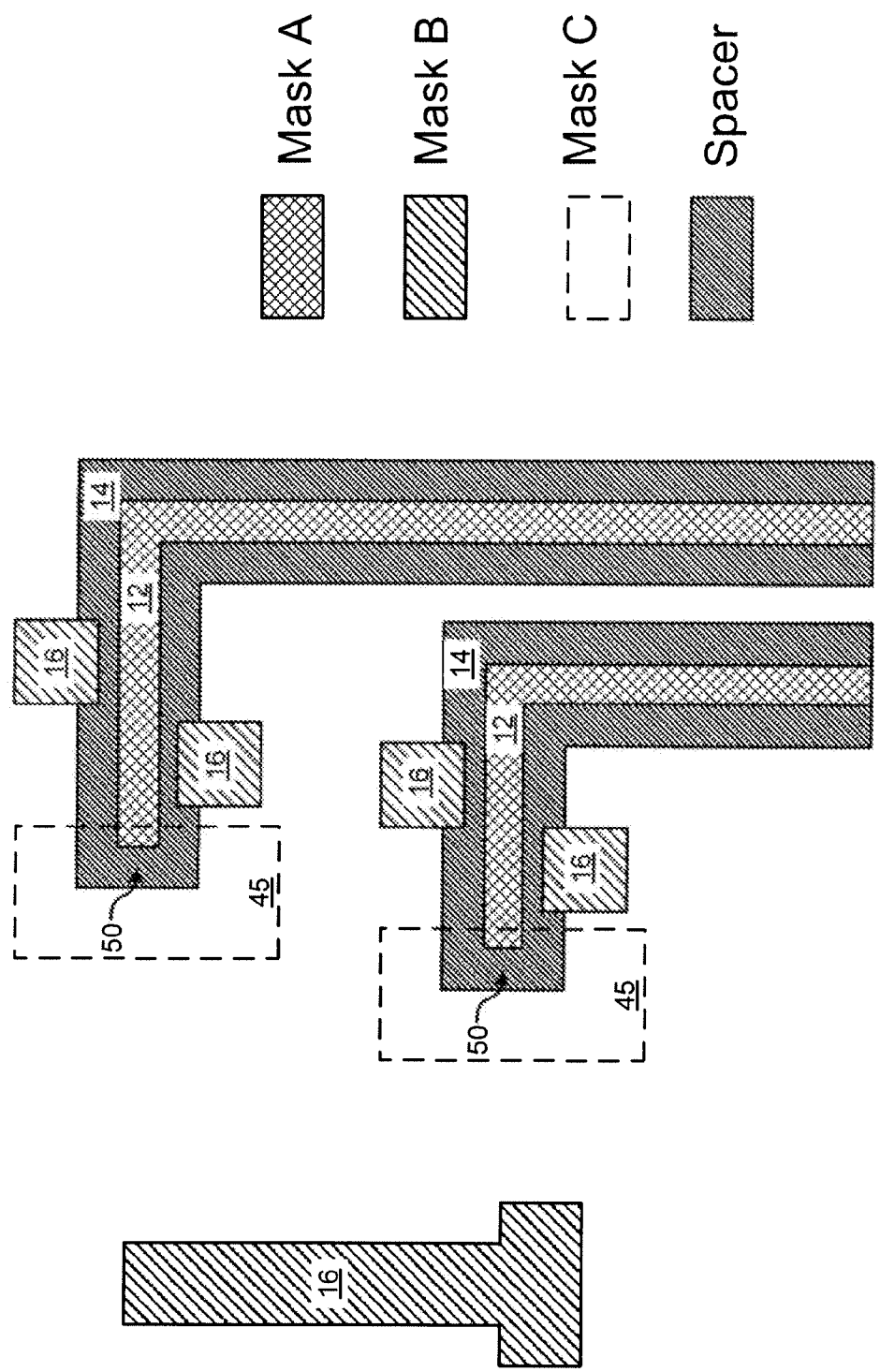
FIG. 2 is a diagram illustrating a top view of a self-aligned double patterning process and masks used to make the illustrated features.
Figure 9:
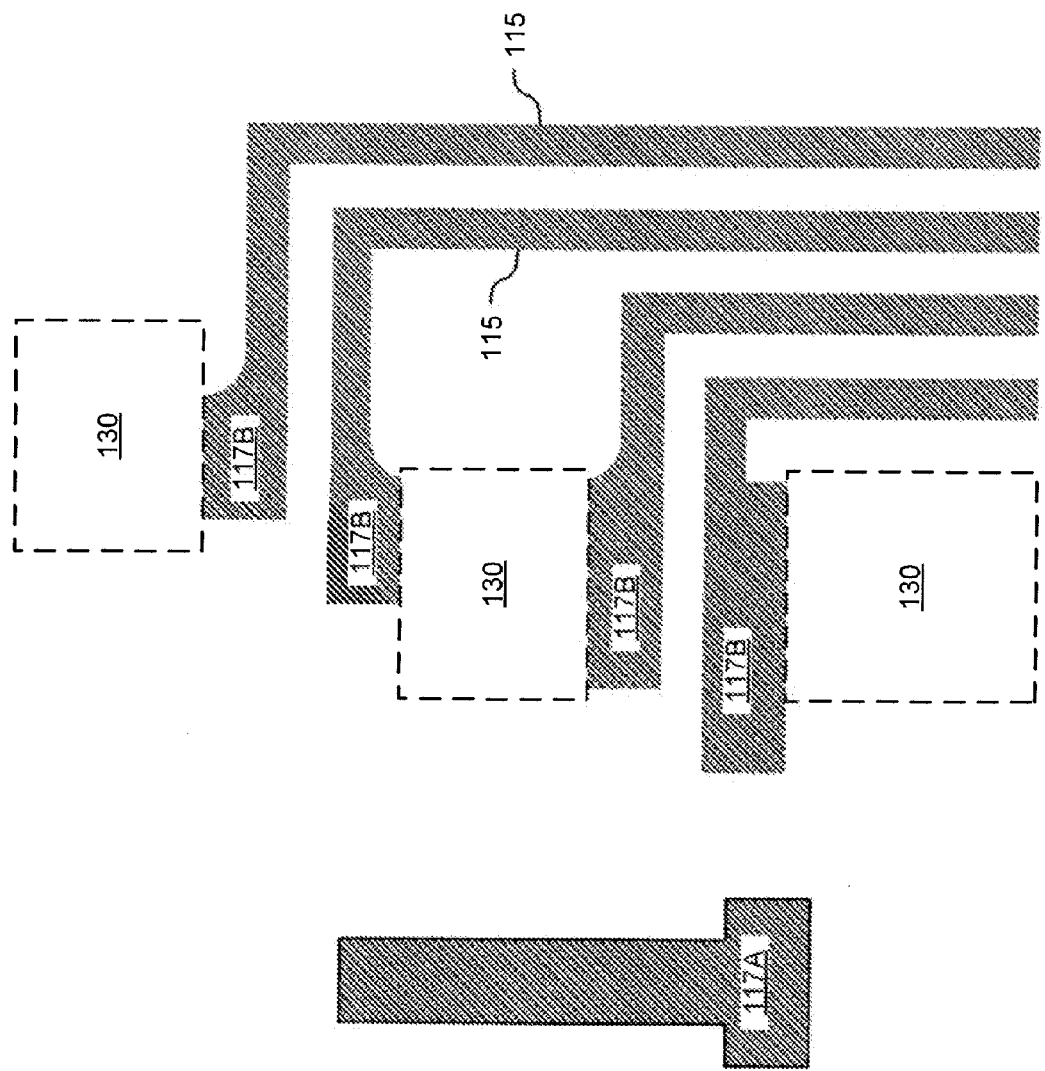
FIG. 9 is a diagram illustrating an example of a mask layer to remove unwanted areas of contacts in accordance with one embodiment of the invention.

At operation 212, shorted line ends (for example, as illustrated in FIG. 2) are removed and contact pads 117B can also be trimmed to the appropriate dimensions. This can be accomplished by a number of methods including a mask operation to etch away the unwanted spacer material. FIG. 9 is a diagram illustrating an example of a mask operation to remove unwanted areas of contacts 117. The areas removed are illustrated by dashed boxes 130. Likewise, other adjustments to feature dimensions can be made at this time.

Figure 10:
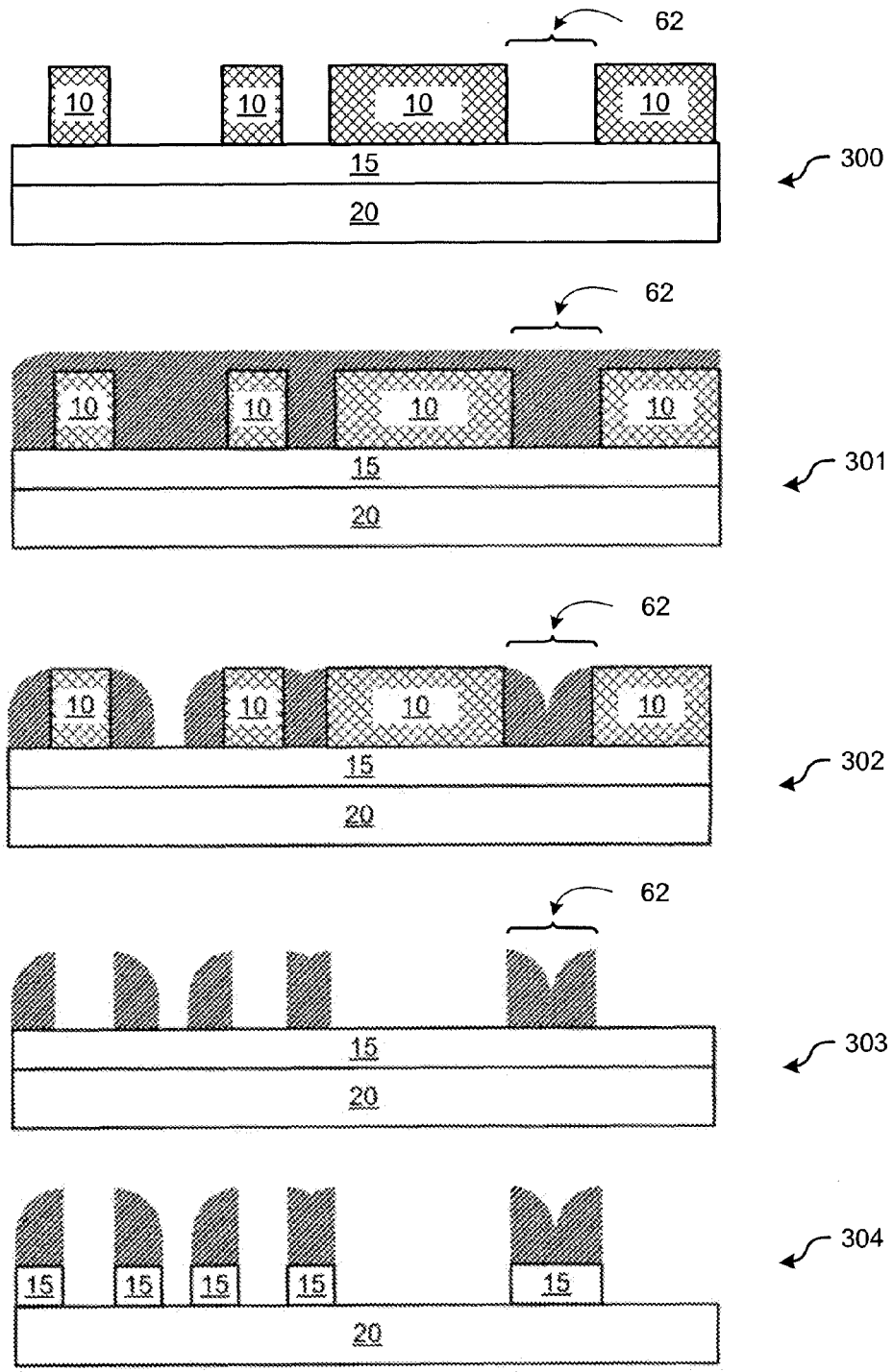
FIG. 10 is a diagram illustrating a cross-sectional view of spacer formation for wide and narrow spaces in accordance with one embodiment of the invention.

As described above with reference to FIG. 1, in conventional processing techniques for self-aligned double patterning, an additional lithography operation is required for mask layer B to patterned onto the substrate (illustrated as photoresist 30 patterned on to spacer material 25) to create features wider than could have been created using conventional spacer techniques. In contrast, in accordance with one embodiment of the invention, the spacer material for these larger-width features can be created in the same mask layer as the one in which narrower lines are created. In other words, additional patterns of sacrificial layer can be placed on the substrate to create the narrow spaces to allow the wider features to be created with spacer material. FIG. 10 is a diagram illustrating a cross-sectional view of spacer formation for wide and narrow spaces in accordance with one embodiment of the invention. Particularly, FIG. 10 illustrates the same example shown in FIG. 1 but with narrow spaces used to create the wider feature thereby eliminating the need for the mask layer used to create photoresist pattern 30.

As this example illustrates, additional patterns of sacrificial layer 10 are used to create a narrow space 62 as illustrated at 300. These can be placed in the same operation as those used to create the lines. As illustrated at 301, spacer material is laid down over the sacrificial layer including in the area of the narrow space 62. After spacer etch, single and double width lines remain as illustrated at 302. Because narrow space 62 was created with the same lithography layer as the wide spaces, there is no need in this process to add photoresist 30 as illustrated at 101. Accordingly, the resultant pattern 303 after removal of the sacrificial material in this example is the same as pattern 103 in FIG. 1 and was achieved without the additional mask layer used to place photoresist 30 on the sacrificial layer. This pattern can be transferred to underlying layer 20 as illustrated at 304. Accordingly, narrow spaces can be used to create contact pads and other features such as, for example, components of registers, bus drivers, peripheral circuitry, glue logic or other logic devices without the need for an additional mask layer.

The term substrate can be used to refer to any material onto which a layer of material is disposed. Substrates can be comprised of any of a number of materials or combinations of materials including metals, ceramics, plastics, glass and other materials. Substrates can include semiconductor substrates such as, for example, GaAs, Si, SiGe or any other semiconductor material, and can include, for example, wafers and dice or any other semiconductor structures, including structures in the process of fabrication, having one or more layers formed thereon.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 11:
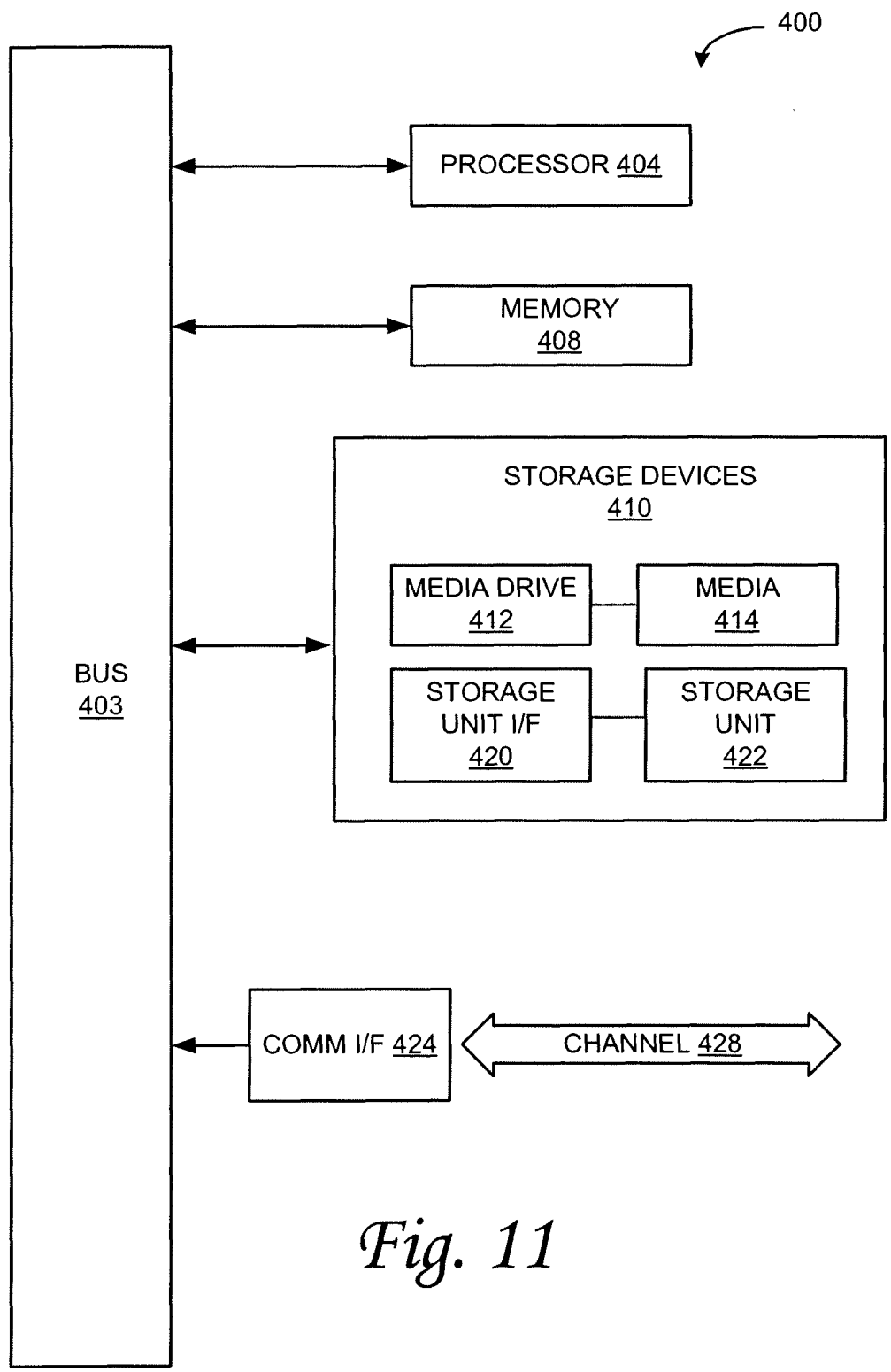
FIG. 11 is a simplified block diagram illustrating an example-computing module in accordance with one embodiment of the invention.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example-computing module is shown in FIG. 11. Various embodiments are described in terms of this example-computing module 400. After reading this description, it will become apparent to a person skilled in the relevant art how to implement the invention using other computing modules or architectures.

Referring now to FIG. 11, computing module 400 may represent, for example, computing or processing capabilities found within desktop, laptop and notebook computers; mainframes, supercomputers, workstations or servers; or any other type of special-purpose or general-purpose computing devices as may be desirable or appropriate for a given application or environment. Computing module 400 might also represent computing capabilities embedded within or otherwise available to a given device. For example, a computing module might be found in other electronic devices. Computing module 400 might include, for example, one or more processors or processing devices, such as a processor 404. Processor 404 might be implemented using a general-purpose or special-purpose processing engine such as, for example, a microprocessor, controller, or other control logic. In the example illustrated in FIG. 11, processor 404 is connected to a bus 403 or other communication medium to facilitate interaction with other components of computing module 400.

Computing module 400 might also include one or more memory modules, referred to as main memory 408. For example, preferably random access memory (RAM) or other dynamic memory, might be used for storing information and instructions to be executed by processor 404. Main memory 408 might also be used for storing temporary variables or other intermediate information during execution of instructions to be executed by processor 404. Computing module 400 might likewise include a read only memory ("ROM") or other static storage device coupled to bus 403 for storing static information and instructions for processor 404.

The computing module 400 might also include one or more various forms of information storage mechanism 410, which might include, for example, a media drive 412 and a storage unit interface 420. The media drive 412 might include a drive or other mechanism to support fixed or removable storage media 414. For example, a hard disk drive, a floppy disk drive, a magnetic tape drive, an optical disk drive, a CD or DVD drive (R or RW), or other removable or fixed media drive. Accordingly, storage media 414, might include, for example, a hard disk, a floppy disk, magnetic tape, cartridge, optical disk, a CD or DVD, or other fixed or removable medium that is read by, written to or accessed by media drive 412. As these examples illustrate, the storage media 414 can include a computer usable storage medium having stored therein particular computer software or data.

In alternative embodiments, information storage mechanism 410 might include other similar instrumentalities for allowing computer programs or other instructions or data to be loaded into computing module 400. Such instrumentalities might include, for example, a fixed or removable storage unit 422 and an interface 420. Examples of such storage units 422 and interfaces 420 can include a program cartridge and cartridge interface, a removable memory (for example, a flash memory or other removable memory module) and memory slot, a PCMCIA slot and card, and other fixed or removable storage units 422 and interfaces 420 that allow software and data to be transferred from the storage unit 422 to computing module 400.

Computing module 400 might also include a communications interface 424. Communications interface 424 might be used to allow software and data to be transferred between computing module 400 and external devices. Examples of communications interface 424 might include a modem or softmodem, a network interface (such as an Ethernet, network interface card, WiMedia, 802.XX or other interface), a communications port (such as for example, a USB port, IR port, RS232 port Bluetooth interface, or other port), or other communications interface. Software and data transferred via communications interface 424 might typically be carried on signals, which can be electronic, electromagnetic, optical or other signals capable of being exchanged by a given communications interface 424. These signals might be provided to communications interface 424 via a channel 428. This channel 428 might carry signals and might be implemented using a wired or wireless medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 408, storage unit 420, media 414, and signals on channel 428. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 400 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the operations are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method of semiconductor device fabrication, comprising:
    depositing a layer of a first material onto a substrate;
    using a single mask during a single mask process to pattern the layer to form a first pattern defining a wide space feature and a narrow space feature in the same mask layer, the narrow space feature defining a line of a semiconductor device and the wide space feature defining a logic device component of the semiconductor device, the wide space feature and the narrow space feature being defined by adjacent shapes in the first pattern;
    depositing spacer material over the first pattern on the substrate;
    etching the spacer material such that the spacer material is removed from horizontal surfaces of the substrate and the first pattern but remains adjacent to vertical surfaces of the first pattern that define the narrow space feature and the wide space feature, the spacer material thereby forming the narrow space feature and the wide space feature;
    depositing additional first material onto the substrate after said etching; and
    planarizing a surface of the device after said additional depositing.

2. The method of claim 1, wherein spacer material remaining in the narrow space feature is approximately twice the width of the spacer material remaining adjacent vertical surfaces of the wide space feature.

3. The method of claim 1, wherein the first material comprises polysilicon material.

4. The method of claim 1, wherein the remaining spacer material forms a spacer pattern and further comprising etching the substrate to transfer the spacer pattern to an underlying layer.

5. The method of claim 1, wherein the logic device component is a contact pad, an address decoder, a multiplexer, a glue logic, a register, or a bus driver.

6. A method of semiconductor device fabrication using spacer double-patterning to create lines of a semiconductor device and components of the semiconductor device in the same mask layer, comprising:
    deposit a first material on a semiconductor substrate;
    using a single mask during a single mask process to pattern the first material into a pattern of first material that defines a line and a space in the same mask layer, the line and the space being defined by adjacent shapes in the first material;
    depositing second material over the substrate;
    etching the second material such that the second material is partially removed from the substrate, whereby the second material that remains forms a pattern of second material comprising a first feature adjacent the line and a second feature within the space, the first feature defining a line of the semiconductor device, and the second feature defining a logic device component of the semiconductor device;
    depositing additional first material onto the substrate after said etching; and
    planarizing a surface of the device after said additional depositing.

7. The method of claim 6, wherein the logic device component is a contact pad, an address decoder, a multiplexer, a glue logic, a register, or a bus driver.

8. The method of claim 6, wherein the first feature is part of a memory array and the second feature is part of a circuit associated with the memory array.

9. The method of claim 6, wherein the second material in the space is approximately twice the width of the second material adjacent the line.

10. The method of claim 6, wherein the second feature is in a range of from one to two times the width of the first feature.

11. The method of claim 6, wherein depositing comprises physical vapor deposition, chemical vapor deposition, electrochemical deposition, molecular beam epitaxy or atomic layer deposition.

12. The method of claim 6, wherein the second material comprises silicon nitride, silicon oxide, or silicon oxynitride.

13. The method of claim 6, further comprising etching the remaining second material to trim contact pads or other components created by the pattern of second material.

* * * * *